(12) United States Patent
Franz et al.

(10) Patent No.: US 7,190,586 B2
(45) Date of Patent: Mar. 13, 2007

(54) HEAT SINK RETENTION ASSEMBLY AND RELATED METHODS

(75) Inventors: John P. Franz, Houston, TX (US); Thomas T. Hardt, Missouri City, TX (US); David Deis, Spring, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 264 days.

(21) Appl. No.: 10/792,972

(22) Filed: Mar. 3, 2004

(65) Prior Publication Data
US 2005/0195572 A1 Sep. 8, 2005

(51) Int. Cl.
*H05K 7/20* (2006.01)
*H01L 23/34* (2006.01)
*F28F 7/00* (2006.01)
*A47B 97/00* (2006.01)
*A44B 21/00* (2006.01)

(52) U.S. Cl. ............... 361/704; 257/718; 257/719; 165/80.3; 165/185; 361/710; 361/719; 248/505; 248/510; 24/457; 24/458

(58) Field of Classification Search ............ 361/704
See application file for complete search history.

(56) References Cited

U.S. PATENT DOCUMENTS

| 2,185,084 | A | * | 12/1939 | Hutaff, Jr. ............... 248/488 |
| 4,648,737 | A | * | 3/1987 | Lake et al. ............. 403/322.4 |
| 5,903,972 | A | * | 5/1999 | Boe .......................... 29/832 |
| 6,243,266 | B1 | * | 6/2001 | Lo .......................... 361/704 |
| 6,282,093 | B1 | * | 8/2001 | Goodwin ................. 361/704 |
| 2004/0114332 | A1 | * | 6/2004 | Lee et al. ................ 361/719 |

* cited by examiner

*Primary Examiner*—Lisa Lea-Edmonds
*Assistant Examiner*—Zachary Pape

(57) ABSTRACT

Heat sink retention assemblies and related methods are described. In one embodiment, a system comprises a base, a handle rotatably mounted on the base, and heat sink retention structure joined with the handle and moveable by the handle between an opened and a closed position effective to secure a heat sink on a substrate.

12 Claims, 5 Drawing Sheets

2

HEAT SINK RETENTION ASSEMBLY AND RELATED METHODS

BACKGROUND

Heat sink mechanisms can be used to remove heat from integrated circuit devices such as processors, application specific integrated circuits (ASICs) and the like. Many heat sink assemblies work by being physically secured to a printed circuit board (PCB) on which the integrated circuit devices are mounted. In operation, the heat sink assembly is placed into physical contact with an associated chip's package and works by providing a thermal path for heat which is generated by operation of the chip.

One way of mounting a heat sink to a printed circuit board is to sandwich the printed circuit board between the heat sink and a metal plate, and then use a number of screws to threadably connect the heat sink to the metal plate through material of the printed circuit board, thereby squeezing the printed circuit board between the metal plate and the heat sink. Another way to mount the heat sink to a printed circuit board is to use clips to clip the heat sink to the printed circuit board.

Using screws to affix a heat sink to a printed circuit board can be time consuming because it requires a person to physically connect each screw. Additionally, using screws can be problematic because unevenly applied force can cause stress to the printed circuit board and possibly damage the printed circuit board. In addition, this solution provides a number of loose parts which can become lost.

Using clips to affix a heat sink to a printed circuit board can also be time consuming because a person has to physically connect each clip. In addition, each clip has the potential to rattle loose thus compromising the mounting arrangement.

Yet other heat sink mounting solutions have involved the use of so-called cages. These cages tend to be bulky and difficult to maneuver around while installing the heat sink. In addition, some cages can block air flow through the enclosure or housing in which the heat sink is mounted which, in turn, can cause the internal enclosure temperature to rise.

DETAILED DESCRIPTION

Overview

In accordance with the embodiments described herein, a heat sink retention assembly is provided that is easy to install and has a profile that promotes air flow through the enclosure in which it is mounted. In addition, in at least some embodiments, the heat sink retention assembly is "tool-less" in that once the heat sink retention assembly is placed into physical contact with the heat sink through a substrate such as a printed circuit board, no tools are needed to complete the affixation of the heat sink retention assembly to the printed circuit board and hence, the heat sink. Further, in at least some embodiments, heat sinks can be more reliably mounted on a printed circuit board by virtue of a simultaneous, multi-point connection that is achieved through one simple motion, as will become apparent below.

In at least some embodiments, once the heat sink retention assembly is mounted on an associated printed circuit board, there are no loose parts that might rattle or become lost during shipping or operation. Thus, the heat sink retention assembly is more reliable than those that have been used in the past.

Exemplary Embodiment

Figure 1:
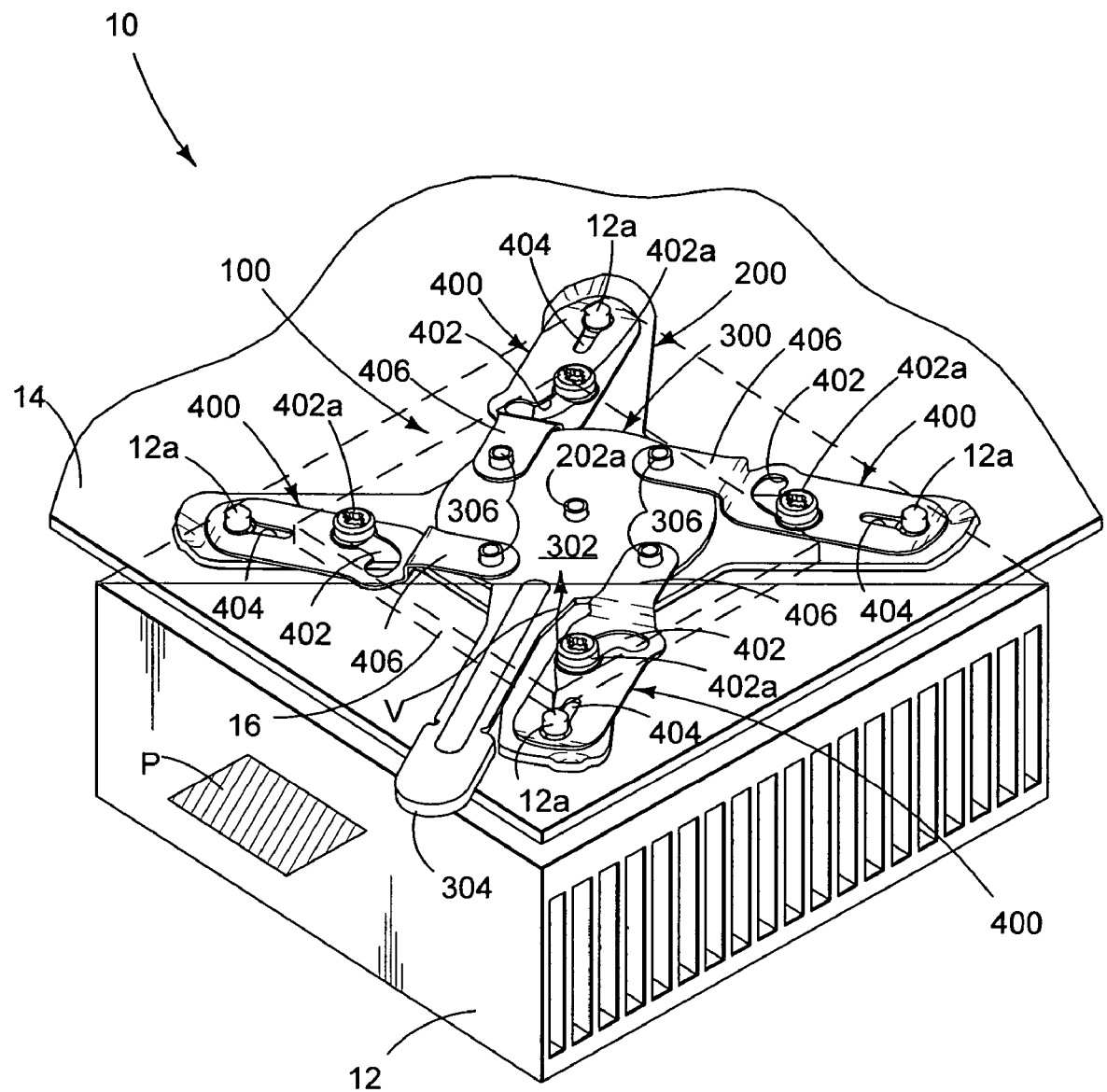
FIG. 1 is an isometric view of a system that employs a heat sink retention assembly in an opened position in accordance with one embodiment.

FIG. 1 shows a system, generally at 10, that employs a heat sink retention assembly in accordance with one embodiment. In this example, system 10 comprises a heat sink 12 that is mounted to a printed circuit board 14 by virtue of a heat sink retention assembly 100. Any suitable type of heat sink can be employed in connection with the inventive embodiments described herein. Accordingly, the specifically illustrated heat sink is not intended to limit application of the claimed subject matter to any one particular type of heat sink.

In this particular example, printed circuit board 14 includes an integrated circuit chip 16 (shown in dashed lines), which can be any suitable type of chip such as a processor, ASIC and the like. The chip can be received by a socket (not illustrated) which is, in turn, mounted on the printed circuit board 14, as will be appreciated by the skilled artisan.

Figure 2:
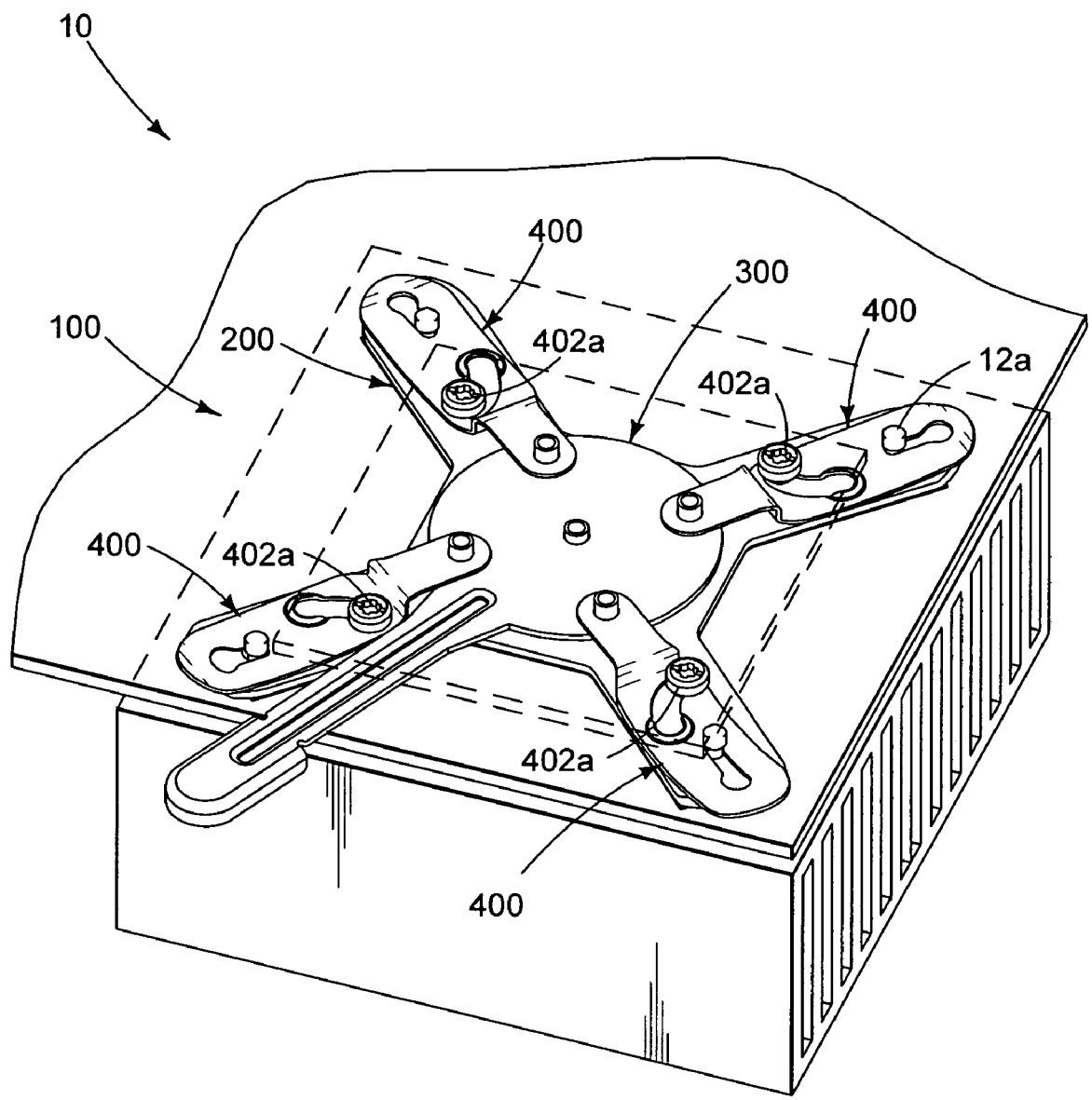
FIG. 2 is an isometric view of a system that employs a heat sink retention assembly in a closed position in accordance with one embodiment.

In accordance with the illustrated and described embodiment, heat sink retention assembly 100 comprises structure that is utilized to retain a heat sink against the printed circuit board 14. In the illustrated and described example, the heat sink retention structure comprises a base plate 200 which is mounted on or otherwise affixed to printed circuit board 14, a handle 300 which is rotatably mounted on base plate 200, and a plurality of link members 400 each of which is pivotably mounted on handle 300 for movement between an opened or first position (FIG. 1) and a closed or second position (FIG. 2). In the illustrated and described embodiment, each of the link members comprises a pair of slots 402, 404 which are utilized to guide link member movement relative to the base plate 200 when the heat sink retention assembly 100 is moved from the opened position to the closed position, as will become apparent below. In this particular example, each slot of a slot pair has a different shape.

Exemplary Base Plate

Figure 5:
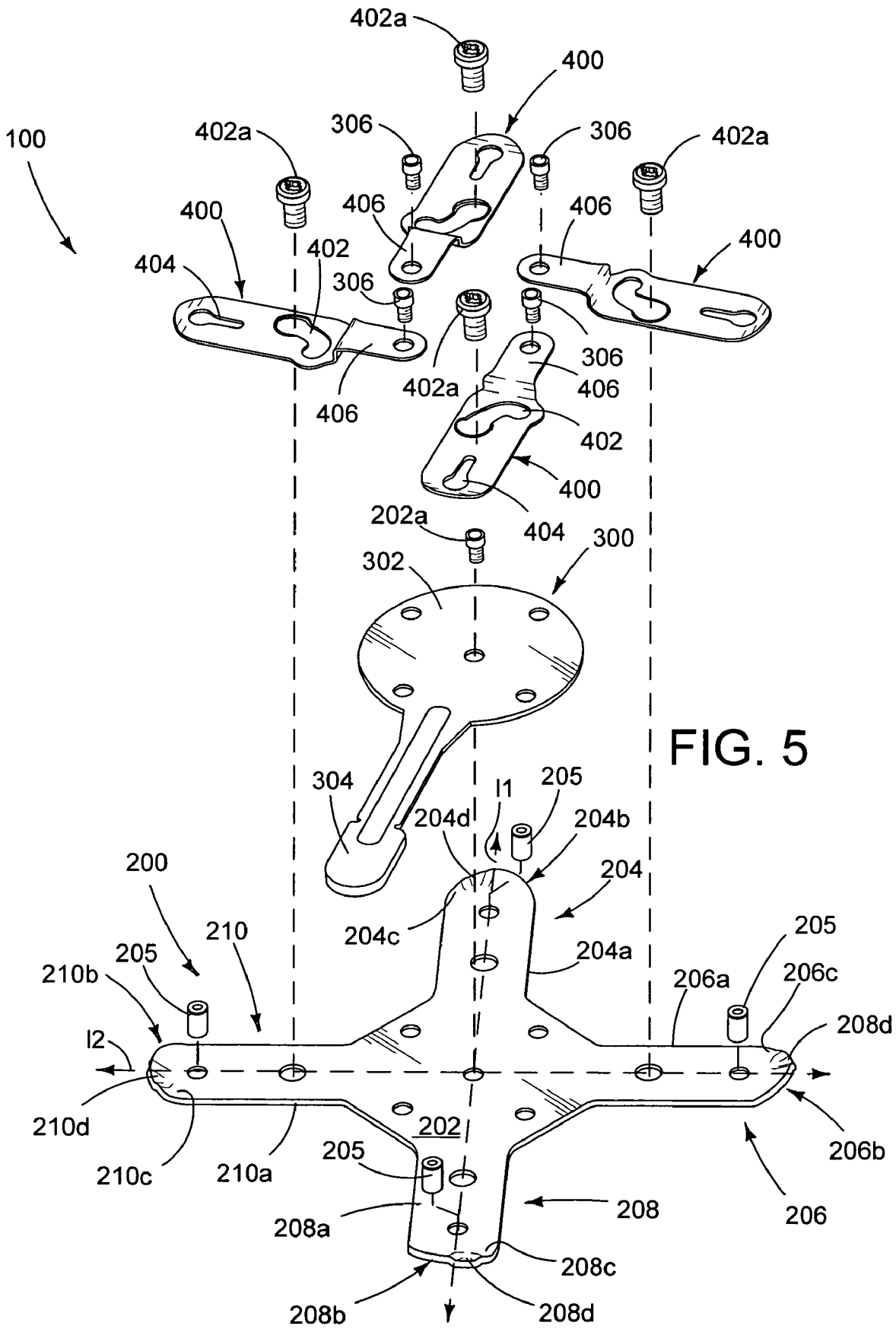
FIG. 5 is an isometric exploded view of an exemplary heat sink retention assembly in accordance with one embodiment.

Referring to FIGS. 1 and 5, base plate 200 comprises a central body portion 202 and a plurality of extensions 204, 206, 208 and 210 joined with the central body portion 202 and extending away therefrom. In the illustrated and described embodiment, central body portion 202 includes a centrally located pin 202a that is mateable with a suitably dimensioned hole on handle 300 to permit the handle to be rotated thereabout relative to the base plate 200 between the opened and closed positions. Although four extensions are shown, any suitable number of extensions can be employed.

In the illustrated and described embodiment, extensions 204, 208 extend along a first common line $l_1$ generally away from each other, and extensions 206, 210 extend along a second common line $l_2$ generally away from each other. In this embodiment, the extensions collectively define an "X" shape which gives the base plate an X-like shape.

In accordance with one embodiment, and as can best be appreciated from the exploded view of FIG. 5, each extension 204, 206, 208 and 210 extends away from central body portion 202 along a respective extension body 204a, 206a, 208a, 210a toward a respective terminus 204b, 206b, 208b and 210b. Proximate each respective terminus 204b, 206b, 208b and 210b, a through hole is provided and is configured to receive a cylinder 205, such as a metal cylinder, that is generally fixedly mounted on the base plate 200.

In the illustrated and described embodiment, each cylinder serves a couple of purposes. First, the cylinders serve a restraint function during operation of the heat sink retention assembly 100 which serves to prevent undesired movement that can prevent proper pin engagement, as will become apparent below. Second, the cylinders serve as guide holes for pins that are mounted on the heat sink 12. Exemplary pins are shown at 12a in FIG. 1. In operation, the heat sink pins are inserted through respective cylinders mounted on each extension and are captured by and ride in a respective slot 404 in each link member, described in detail below.

In accordance with one embodiment, each extension body is generally flat or planar along a majority of its length. Toward the terminus of each extension body, material of the extension bends generally away from the majority of the extension body to define a ramp 204c, 206c, 208c and 210c. Each ramp is designed to provide a degree of lift to its associated link member 400 and to load an associated heat sink pin 12a which, in turn, serves to urge the heat sink against its associated integrated circuit chip, as will become apparent below in the discussion of FIGS. 3 and 4. Although the ramp can be disposed at any suitable angle relative to the majority of its extension body, an angle in the range from between 20 to 45 degrees has been found suitable for providing a smooth transition from the open to the closed position. In accordance with one embodiment, each extension body terminus can have a respective divot 204d, 206d, 208d and 210d which serves to reduce the tendency of the link member 400 to dig into the terminus, due to bending, when the heat sink retention assembly 100 is in transition to the closed position.

Although any suitable material, such as plastics and the like can be utilized to form base plate 200, in at least one embodiment, the base plate is formed from a metal material such as cold rolled steel. Using such a material provides a desirable degree of strength and provides a suitable substrate on which an industrial adhesive can be used to fixedly bond the base plate onto the printed circuit board.

Exemplary Handle

In accordance with at least one embodiment, handle 300 comprises a central body portion 302 having a hole that is dimensioned to receive central pin 202a on base plate 200, and a grippable extension 304 joined with the central body portion and extending generally away therefrom. Although the handle can be formed from any suitable material, such as plastics and the like, in at least one embodiment, the handle is formed from cold rolled steel which provides a desirable degree of strength.

In accordance with the illustrated and described embodiment, central body portion 302 has a plurality of through holes about its periphery, each of which receives a cylinder or pin 306. The cylinders or pins are designed to serve as connection points for a respective link member that allows an associated link member to be pivoted between the opened and closed positions, as will become apparent below.

In accordance with the described embodiment, the handle is grippable and of suitable length to provide a mechanical advantage so that the handle can be moved between the opened position (FIG. 1) and the closed position (FIG. 2).

Exemplary Link Members

In the illustrated and described embodiment, four link members 400 are provided and are connected to handle 300 for simultaneous movement with the handle when the handle is moved between the opened position (FIG. 1) and the closed position (FIG. 2). In the illustrated and described embodiment, each link member is connected to handle 300 by virtue of the cylinders or pins 306 mentioned just above. As noted above, each link member comprises a pair of slots 402, 404. In the illustrated example, slot 402 comprises a first slot, and slot 404 comprises a second slot. Each link member also comprises a flange 406 with a through hole that receives an associated cylinder or pin 306.

In accordance with one embodiment, slot 402 is generally arcuate or J-shaped and receives a screw or pin 402a which is connected to base plate 200. Each of pins 402a rides in its associated slot when the handle is moved between the opened and closed position. The effect of the slot/pin arrangement just described is to allow the link members to pivot "over center" which can prevent accidental unlocking since self-loading holds the system in the locked or closed position. More specifically, when the heat sink retention assembly 100 is in the opened position, each of the screws 402a is disposed proximate the top of the "J" of the J-shaped slot, as shown in FIG. 1. When the handle is moved to the locked or closed position, the link member pivots over center and moves the bottom part of the "J" to engage with and lock an associated screw 402a in place, as shown in FIG. 2.

Movement of link members 400 in connection with handle 300 movement can be seen from a comparison of FIGS. 1 and 2. There, in the opened position (FIG. 1), each of the associated screws 402a is disposed proximate the top of each associated "J" slot. In the closed position (FIG. 2), each of the link members 400 has been pivoted over center to move the bottom part of each "J" into contact with each associated screw to thereby capture the screw, as noted above.

In accordance with one embodiment, slot 404 is generally keyhole-shaped and comprises an opening that is situated over an associated cylinder that is received in an associated base plate extension terminus 204b, 206b, 208b and 210b, and a narrow slot portion that extends away from the opening generally towards the J-slot 402.

In operation, each slot 404 receives a pin 12a that is connected to an associated heat sink. As the handle is moved from the opened to the closed position, each pin 12a moves from the keyhole opening and into the narrow slot portion, as will become apparent below.

The link members can be formed from any suitable material, such as plastics and the like. In accordance with one embodiment, each link member is formed from stainless steel which provides a fortified construction that is less likely to yield under load.

Figure 6:
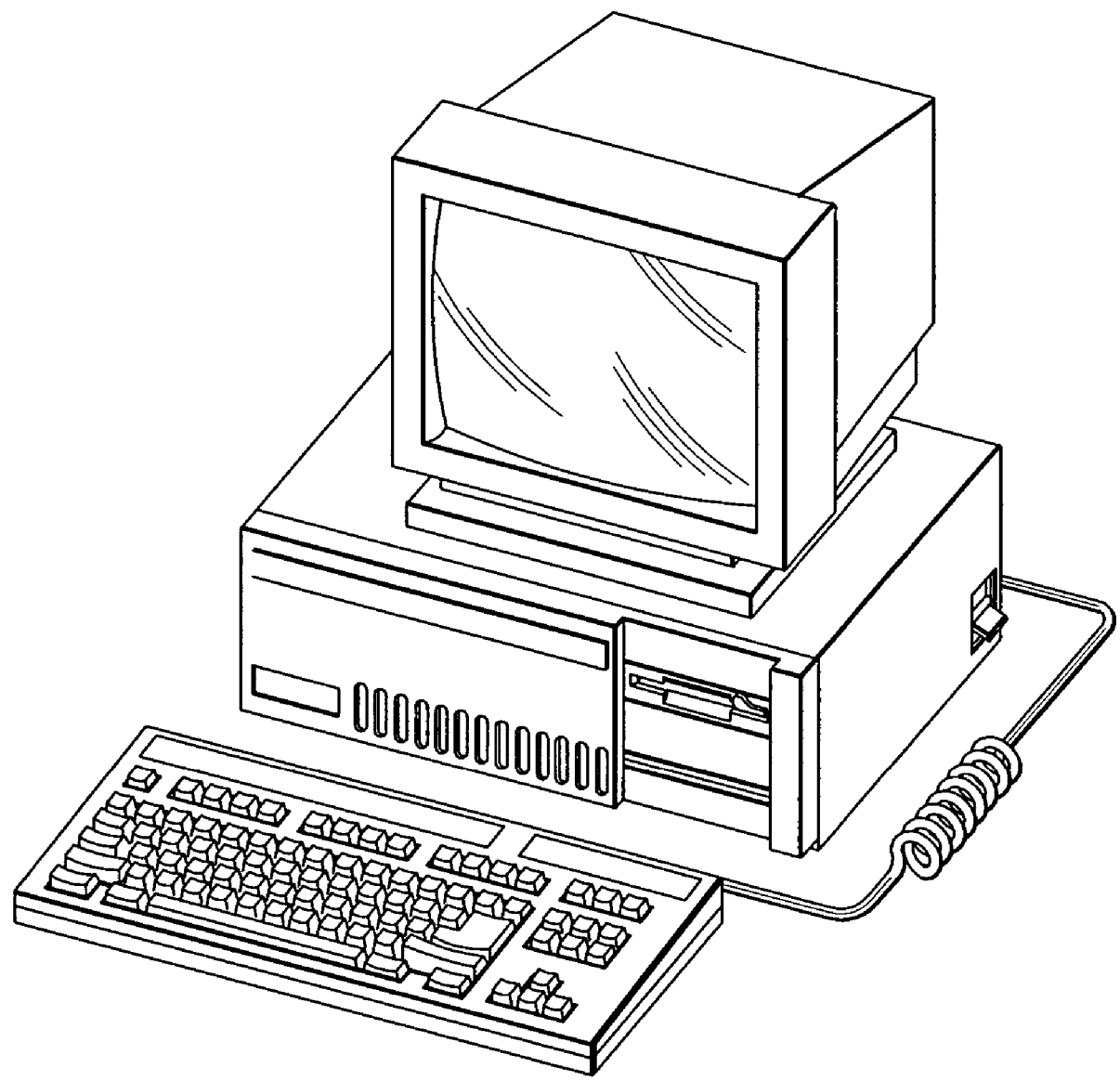
FIG. 6 is a view of an exemplary computer system with which the exemplary embodiments can be employed.

FIG. 6 shows an exemplary computer system that can utilize or otherwise contain system 10.

In Operation

In accordance with the described embodiment, a heat sink can be mounted on an associated substrate such as a printed circuit board by virtue of a simultaneous, multi-point connection that is achieved through one simple motion. In the illustrated and described embodiment, four heat sink connection points are provided.

More specifically, heat sink retention assembly 100 is mounted on a substrate such as printed circuit board 14 (FIG. 1) by affixing or otherwise bonding base plate 200 on printed circuit board 14. Once the heat sink retention assembly 100 is mounted on the printed circuit board and after an integrated circuit chip, such as chip 16 is installed on the printed circuit board, the heat sink is installed on the printed circuit board by inserting each of the heat sink pins 12a through mating holes on the printed circuit board and associated cylinders 205 that are received in base plate extensions 204, 206, 208 and 210 as noted above. Inserting the pins 12a through the mating holes as just described moves each head of an associated pin 12a into an associated opening of an associated slot 404. At this point, the heat sink retention assembly 100 is in the opened position and the heat sink is fully seated.

Figure 3:
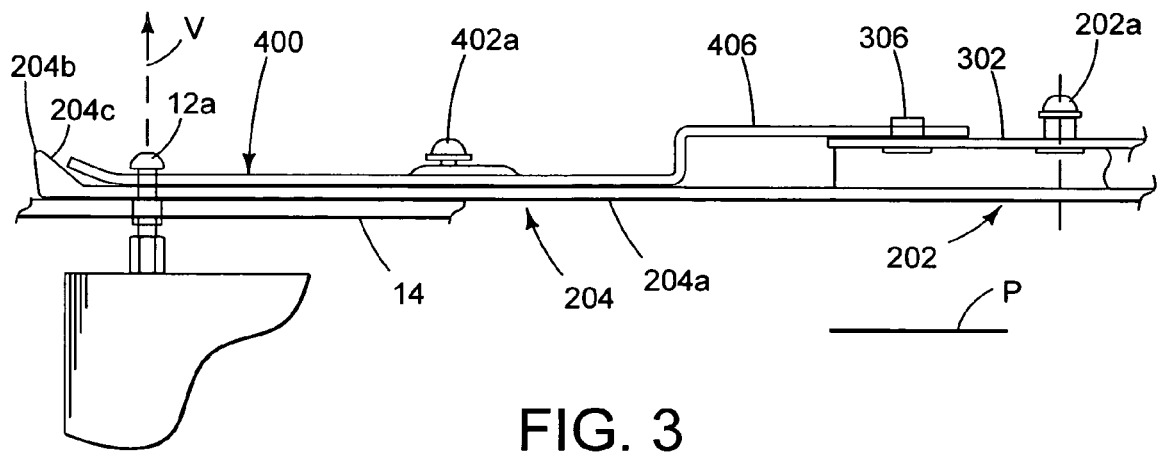
FIG. 3 is a side elevational view of an exemplary link member and portions of a base plate in an opened position in accordance with one embodiment.
Figure 4:
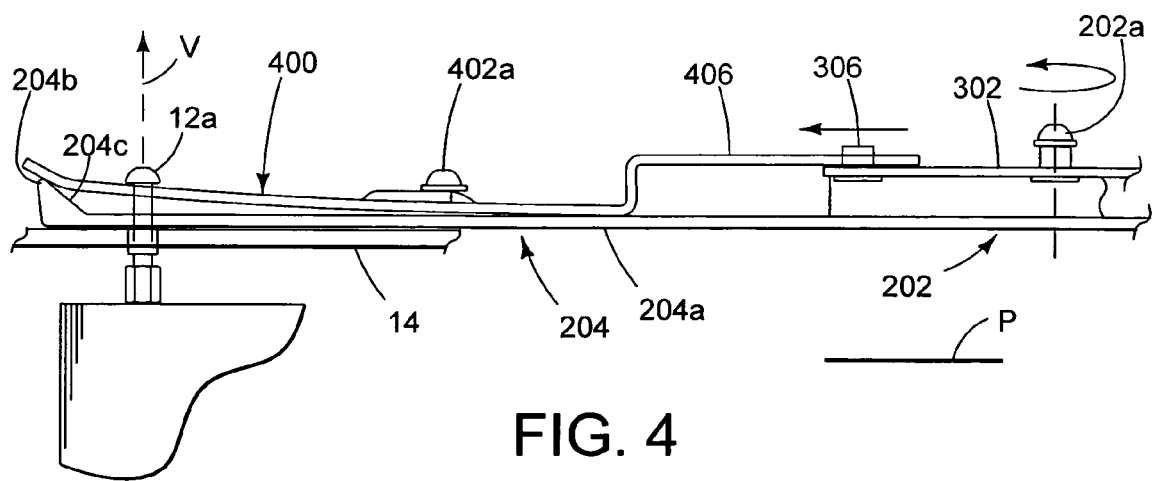
FIG. 4 is a side elevational view of an exemplary link member and portions of a base plate in a closed position in accordance with one embodiment.

FIGS. 1 and 3 show the heat sink retention assembly 100 in the opened position. FIG. 3 is a side elevational view that shows an individual link member 400 with a pin 12a received in the opening of slot 404, and a pin 402a received in the upper portion of the J-slot. Notice that in the opened position, the link member 400 lies in a generally flush disposition atop base plate extension 204. In accordance with the illustrated and described embodiment, in the opened position the link member 400 is not yet engaged with ramp 204c.

To close the heat sink retention assembly 100, handle 300 is moved or rotated so that each of the link members 400 pivots over center, moving each pin 402a within the J-slot 402 to lock the pin 402a in the bottom portion of the J slot. In the illustrated and described embodiment, handle 300 is moved in a plane P (FIG. 1). Simultaneously with this rotational handle movement, and as perhaps best illustrated in FIG. 4, link members 400 are moved generally along the length of each extension which causes the link member to engage the ramp 204c and ride up on the ramp. When the link member rides up on the ramp 204c, the bottom portion of each pin 12a is loaded by the link member along a vector v which is generally orthogonal to plane P. This, in turn, causes the heat sink 12 (FIG. 1) to be moved in a direction towards printed circuit board 14 to thereby urge the heat sink against the integrated circuit chip 16, to thus establish a thermal interface for promoting heat removal from the chip. Thus, the rotational handle movement is translated into a heat sink capture movement. The J-shape of each slot 402 allows the system to travel to such a point that loading creates an over center condition thereby locking the system into the closed position.

CONCLUSION

In accordance with the embodiments described above, a heat sink retention assembly is provided that is easy to install and has a profile that promotes air flow through the enclosure in which it is mounted. In addition, in at least some embodiments, the heat sink retention assembly is "tool-less" in that once the heat sink retention assembly is placed into physical contact with the heat sink through the printed circuit board, no tools are needed to complete the affixation of the heat sink retention assembly to the printed circuit board and hence, the heat sink. Further, in at least some embodiments, heat sinks can be more reliably mounted on a printed circuit board by virtue of a simultaneous, multi-point connection that is achieved through one simple motion. In at least some embodiments, once the heat sink retention assembly is mounted on an associated printed circuit board, there are no loose parts that might rattle loose during shipping or operation. Thus, the heat sink retention assembly is more reliable than those that have been used in the past.

Although the inventive concepts have been described in language specific to structural features and methodological steps, it is to be understood that the inventive concepts defined in the appended claims are not necessarily limited to the specific features or steps described. Rather, the specific features and steps are disclosed as preferred forms of implementing the claimed inventive concepts.

What is claimed is:

1. A system comprising:
   a printed circuit board configured to support integrated circuit components;
   a heat sink retention assembly mounted on the printed circuit board and configured to retain a heat sink on the printed circuit board, the heat sink retention assembly comprising:
      a base plate mounted on the printed circuit board having a plurality of pins fixed on the base plate;
      a handle rotatably mounted on the base plate; and
      a plurality of link members each pivotably mounted on the handle for movement relative to the base plate between an opened position and a closed position, wherein each link member comprises a pair of slots, a first of which receives a base plate pin, a second of which receives and captures a heat sink pin.

2. The system of claim 1, wherein said first slots are generally arcuate.

3. The system of claim 1, wherein said first slots are J-shaped.

4. The system of claim 1, wherein the base plate comprises a central body portion and a plurality of extensions joined with the central body portion and extending away therefrom, wherein each extension supports one of said plurality of pins.

5. The system of claim 4, wherein said central body portion comprises a centrally located pin that is mateable with a hole on said handle to permit said handle to be rotated thereabout relative to the base plate between the opened and closed positions.

6. The system of claim 4, wherein the base plate comprises four extensions.

7. The system of claim 4, wherein the base plate comprises four extensions, two of which extend along a first common line generally away from each other, two others of which extend along a second common line generally away from each other.

8. The system of claim 4, wherein the base plate comprises four extensions, two of which extend along a first common line generally away from each other, two others of which extend along a second common line generally away from each other, and wherein the extensions collectively define an "X" shape.

9. The system of claim 4, wherein each extension extends away from the central body portion along a respective extension body toward a respective terminus, each extension comprising a through hole that receives a cylinder each of which being configured to receive an associated heat sink pin.

10. The system of claim 4, wherein each extension extends away from the central body portion along a respective extension body toward a respective terminus, wherein each extension body is generally flat along a majority of its length, and wherein each terminus bends generally away from the majority of the extension body to define a ramp, each ramp being configured to provide a degree of lift to an associated link member and to thereby load an associated heat sink pin.

11. The system of claim 1 further comprising an integrated circuit chip mounted on the printed circuit board and a heat sink connected with the heat sink retention assembly and in contact with the integrated circuit chip.

12. A computer embodying the system of claim 11.

* * * * *